United States Patent [19]

Schade, Jr.

[11] 4,034,239
[45] July 5, 1977

[54] CAPACITANCE MEMORIES OPERATED WITH INTERMITTENTLY-ENERGIZED INTEGRATED CIRCUITS

[75] Inventor: Otto Heinrich Schade, Jr., North Caldwell, N.J.

[73] Assignee: RCA Corporation, New York, N.Y.

[22] Filed: July 6, 1976

[21] Appl. No.: 702,400

[52] U.S. Cl. .......................... 307/238; 307/296 A; 307/251; 357/41
[51] Int. Cl.² ................. H03K 17/60; G11C 11/34; H01L 27/02
[58] Field of Search ....... 307/296, 238, 251, 235 B, 307/303; 328/151; 357/41

[56] References Cited

UNITED STATES PATENTS

| | | | |
|---|---|---|---|
| 3,521,141 | 7/1970 | Walton | 307/251 |
| 3,524,996 | 8/1970 | Raper et al. | 307/251 |
| 3,551,698 | 12/1970 | Smith | 307/238 |

OTHER PUBLICATIONS

"Analog Storage Circuit" by Beck, IBM Tech. Disclo. Bull., vol. 9, No. 7, Dec. 1966, pp. 916–917.
"M.o.s.t,s Store Analogue Voltages for Long Periods" by Dunlop in Electronic Engineering, Nov. 1971, pp. 34–35.
"Analog Sample/Hold Circuit for Physiological Signal Monitoring" by Johnson, IEEE Transactions on Biomedical Engineering, Sept. 1975, pp. 420–422.

Primary Examiner—Stanley D. Miller, Jr.
Attorney, Agent, or Firm—H. Christoffersen; S. Cohen; A. L. Limberg

[57] ABSTRACT

Capacitance memories operated with intermittently-energized monolithic integrated circuits tend to lose information during periods between the spaced intervals the integrated-circuits are energized. This tendency, attributable to sneak conduction paths in the un-energized integrated circuit, is forestalled by inserting the channel of a field-effect transistor in series with the memory capacitance, which channel is rendered conductive when only the energizing potential is supplied to the integrated circuit.

4 Claims, 4 Drawing Figures

CAPACITANCE MEMORIES OPERATED WITH INTERMITTENTLY-ENERGIZED INTEGRATED CIRCUITS

The present invention concerns capacitance memories operated together with intermittently energized monolithic integrated circuits—e.g., those receiving energizing potentials directly from a-c power mains during alternate half-cycles of a-c line potential.

Examples of this type of circuit are sample-and-hold circuits, d-c restoration circuits, integrators over intervals relatively long compared to the duration of an a-c line potential cycle, and various other analog memories. A problem which arises is that, in the intervening periods between the spaced intervals during which energizing potential is applied to the monolithic integrated circuit, sneak paths are presented which permit leakage of charge to or from the memory capacitor.

The present invention contemplates serial connection of the memory capacitor and an analog switch included within the integrated circuit. This switch is conductive during the spaced intervals when energizing potential is supplied to the integrated circuit, permitting charging or discharging of the memory capacitor by the rest of the integrated circuit, and is non-conductive during the intervening periods between the aforesaid spaced intervals, forestalling change in the quantity of charge stored in the memory capacitor. The present inventor has found that an appropriate device for constructing an analog switch of the sort desired, when using a P-substrate monolithic integrated circuit, comprises a doubly-isolated N-channel enhancement-mode conductor-insulator-semiconductor (e.g., metal-oxide semiconductor) transistor having its gate biased positively during those spaced intervals energizing potential is supplied to the integrated circuit.

Figure 1:
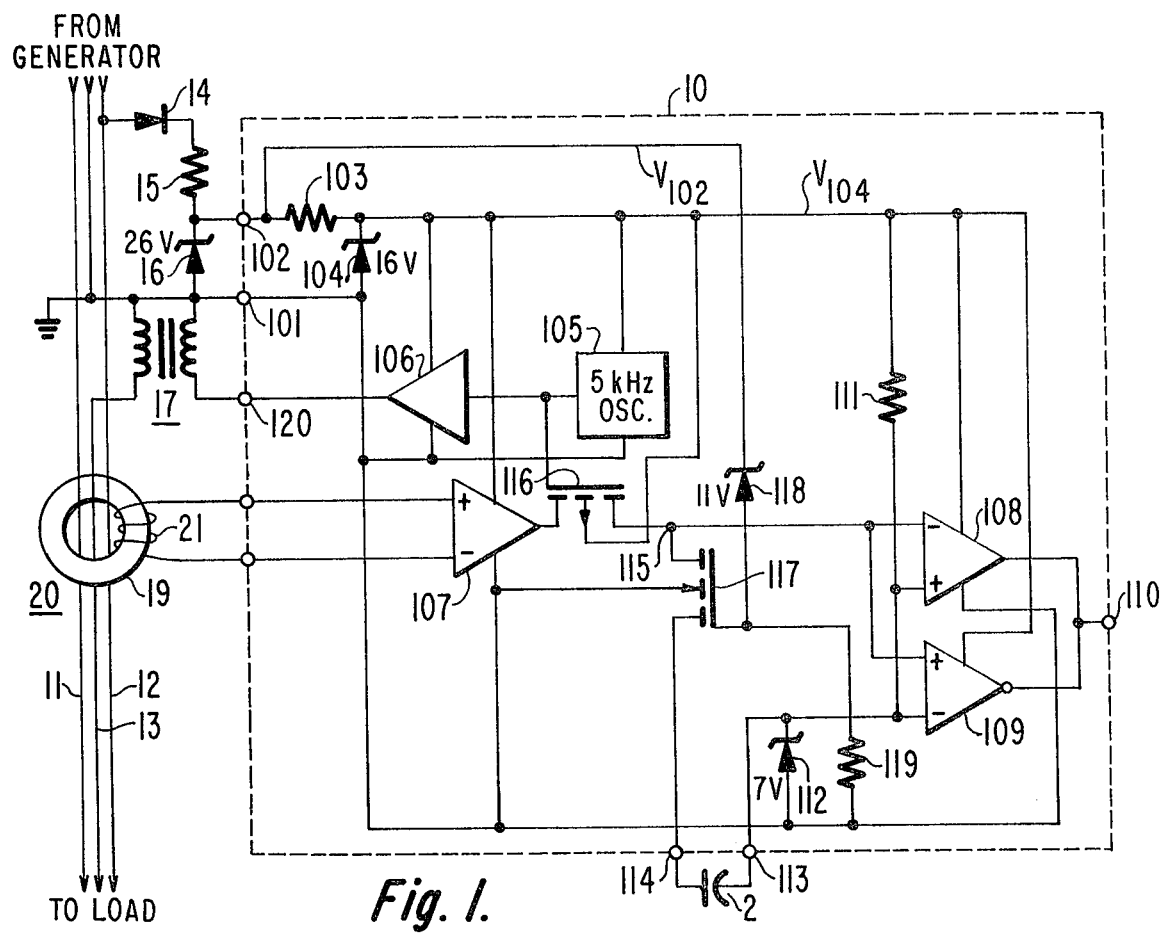
FIG. 1 is a schematic diagram partially in block form of a ground-fault detection apparatus as may be feasibly constructed in monolithic integrated circuit form by reason of the present invention being embodied therein.

In FIG. 1, monolithic integrated circuit 10 constructed on a chip is arranged together with other elements for detecting the presence of ground faults on either of line conductors 11 and 12 or neutral faults on a neutral conductor 13 in a three-wire grounded-neutral balanced-single-phase a.c. (e.g., 60 Hz) power distribution system. Integrated circuit 10 is arranged to be line-operated, energizing potential being applied every half cycle of a-c line voltage between its terminals 101 and 102. To this end, diode 14 provides half-wave rectified current to the off-chip voltage-clipping network comprising series-pass resistor 15 and shunt-clipper avalanche diode 16. The resulting clipped half-wave rectified a-c line potential $V_{102}$ at terminal 102 (e.g., of 26v peak amplitude) is further clipped by a further on-chip voltage-clipping network comprising series-pass resistive element 103 and shunt-clipper avalanche diode 104. Diode 104 has a lower avalanche breakdown voltage than that of diode 16 (e.g., 16v as compared to 26v); and the waveform of the doubly clipped half-wave rectified line voltage approaches a square wave.

This doubly clipped half-wave rectified line voltage $V_{104}$ across diode 104 is used as an energizing potential for: a 5kHz oscillator 105, which may be a relaxation oscillator; buffer amplifier 106; keyed amplifier 107, used as a synchronous detector at power line frequency; and amplifiers 108 and 109, used as threshold detectors. Threshold detector 108 supplies output signal to terminal 110 when the potential applied to the input terminals of detector 108 and 109 exceeds a negative threshold potential; threshold detector 109 supplies an output signal to terminal 110 when this potential exceeds a positive threshold level.

The energizing potential $V_{104}$ is also applied to a further on-chip voltage-clipping network comprising a series-pass resistive element 111 and shunt-clipper avalanche diode 112. Diode 112 has an avalanche breakdown voltage $V_{112}$ that is even lower than that of diode 104 (e.g., 7v). So, a substantially square-wave reference potential $V_{113}$ thus appears at terminal 113 of integrated circuit 10. Memory capacitor 2 has one of its ends connected to terminal 113 and the other to terminal 114 of integrated circuit 10. Capacitor 2 is used to store information provided at point 115 by synchronous detection processes involving keyed amplifier 107, which amplifies at such times energizing potential is applied to it and so synchronously detects signals at power line frequency, and P-channel field-effect transistor 116 operated as a transmission gate, which, by application of oscillations to its gate electrode from oscillator 105, is periodically rendered conductive and so synchronously detects 5kHz signals.

In accordance with the present invention, capacitor 2 is not continuously connected to point 115, but only at such times as energizing potential is available to the rest of the integrated circuit. The analog switch that controls the connection of capacitor 2 to point 115 is N-channel field effect transistor 117. When $V_{102}$ is substantially zero-valued during alternate half cycles of power line frequency, insufficient voltage obtains at terminal 102 to cause avalanche conduction in diode 118. Therefore, resistive element 119 holds the gate electrode of N-channel FET 117 at ground potential. This prevents forward biasing of the gate electrode of this enhancement-mode device 117 with respect to its channel, causing the channel of FET 117 to be non-conductive and disconnect point 115 from capacitor 2.

When $V_{102}$ is of sufficient amplitude to cause avalanche breakdown of diode 118, positive potential is applied to the gate electrode of FET 117. The breakdown potential $V_{118}$ of diode 118 is designed to be of a value (e.g., 11) such that the gate potential responsive to $V_{102}$ applied to FET 117 will be sufficient to cause conduction of FET 117 only when $V_{102}$ exceeds $V_{104}$ by an appreciable amount. This is arranged by making $V_{118}$ greater than the peak value of $V_{104}$ minus both the peak value of $V_{113}$ and the threshold voltage of FET 117. This assures that FET 117 will connect capacitor 102 to point 115 only at such times as energizing potential $V_{104}$ is applied to: oscillator 105; amplifiers 106, 107; and voltage comparators 108, 109.

Oscillations from oscillator 105 are amplified in buffer amplifier 106, which supplies the amplified oscillations to terminal 120 for coupling to the neutral conductor 13 via transformer 17. Conductors 11, 12 and 13 thread a core 19 to serve as primaries of a differential current transformer 20, the core 19 of which is wrapped by a secondary winding 21. In the absence of a ground fault in neutral conductor 13 on the load side of transformer 20, no 5kHz current components will flow in conductor 13 and there will be no 5kHz current induced in winding 21.

When a ground fault is present on neutral conductor 13 on the load side of transformer 20, amplified 5kHz oscillation current will be induced in that portion of conductor 13 threading core 19, inducing 5kHz currents in winding 21. These 5kHz currents, which occur during the alternate half-cycles of the a-c line power in which energizing potential is applied to oscillator 105 and amplifier 107, are amplified by amplifier 107 and are synchronously switched by FET 116 to cause the accumulation of charge on capacitor 2 when it is connected to point 115 by FET 117. This causes a potential to be developed across capacitor 2, which potential is applied to the input circuits of the threshold detectors 108 and 109, and will be of sufficient amplitude and correct polarity to exceed the threshold potential required to cause one of the threshold detectors 108, 109 to supply output signal to terminal 110.

Absent a ground fault in one of the line conductors 11 and 12, the power line currents flowing to and from the load are substantially equal, so there is no substantial current of power line frequency (e.g., 60 Hz) induced in winding 21. When a ground fault occurs on either of line conductors 11 and 12, the instantaneous currents flowing to and from the load will not be equal and so a current at power line frequency will be induced in winding 21. This current synchronously switched by keyed amplifier 107 and subsequently chopped at a 5kHz rate by FET 116 will cause accumulation of charge on capacitor 2 when it is connected to point 115 by FET 117. This causes a potential to be developed across capacitor 2 which potential is applied to the input circuits of the threshold detectors 108 and 109 and will be of sufficient amplitude and correct polarity to exceed the threshold potential required to cause one of the threshold detectors 108, 109 to supply output signal to terminal 110.

The appearance of output signal on terminal 110 is, then, indicative of the presence of a ground-fault on one of the conductors 11, 12, 13. This output signal may be used for actuating a ground-fault indicator (not shown). Alternatively, this output signal may be used for actuating a relay switch (not shown) connected to open the conductors 11, 12 and 13 and forestall delivery of current through them, thus implementing a ground-fault interrupter apparatus.

Figure 2:
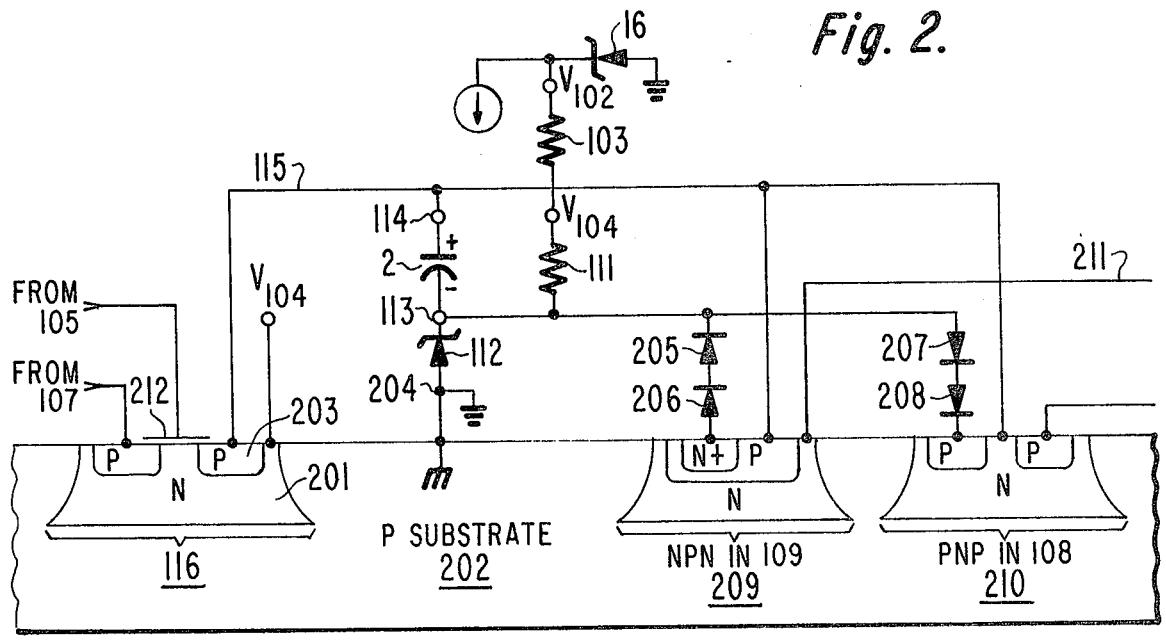
FIG. 2 is an illustration of the parasitic conduction paths deleterious to retention of charge on the memory capacitor of a circuit such as shown in FIG. 1 should the present invention not be used.

FIG. 2 shows portions of the parasitic circuit that could exist in the FIG. 1 circuit during the times $V_{104}$ is zero-valued if the connection of terminal 114 to point 115 were a direct connection rather than through an appropriate analog switch such as FET 117. When the capacitor has been charged sufficiently to cause potential at terminal 114 to exceed that at terminal 113 by about two junction offset potentials, a discharge path exists. The N-material isolation tub 201 for FET 116, which normally is reversed biased with respect to P substrate 202, no longer is, so the parasitic PNP transistor existing between substrate 202, isolation tub 201, and P region 203 becomes conductive to couple connection 115 to substrate 202, which is grounded. This applies the potential across capacitor 2 to avalanche diode 112 so as to forward bias it into conduction and a loop is thus completed which can discharge capacitor 2. One can forestall this particular mode of discharge by connecting a blocking diode in back-to-back connection with a diode between terminal 113 and the ground connection 204, but other undesired paths for discharge obtain. For example, there is a loop for discharge through the parasitic transistor just described, capacitor 2, and bleeder resistors 111 and 103 to the zero-valued $V_{102}$. There can be discharge paths completed through the isolation tubs holding diodes 205, 206, 207, 208 which may be used together with resistors 209 and 210 for establishing threshold potentials in voltage comparators 108 and 109. A discharge path can be completed through the parasitic PNP associated with NPN transistor 209 when its collector potential applied via lead 211 falls to ground potential. The fall of the potential on the gate electrode 212 of FET 116 towards ground potential will render its channel conductive and provides means for completing a sneak path for charge through keyed amplifier 107 if it be of a type presenting a path from its output terminal to ground when not supplied energizing potential.

As pointed out above, these paths for discharge of capacitor 2 can be interrupted by inserting the controlled conduction path of an analog switch in series with capacitor 2, which controlled conduction path is conductive only when energizing potential $V_{104}$ is at peak value. An enhancement mode N-channel conductor-insulator-semiconductor field-effect transistor 117 shown in plan and profile in FIGS. 3 and 4, respectively, is particularly advantageous for use as the analog switch, the controlled conduction path of which is to be serially connected with the memory capacitor 2. This device is constructed within a region 302 of P-material, located at an exposed surface of an N-material isolation tub 301. Isolation tub 301 is located on the same P-material substrate 202 as the other elements in the monolithic integrated circuit. Regions 303 and 304 of N+ material defining the ends of the channel of transistor 117, are ohmically contacted by metallization 305 and 306 that connects one of these ends to terminal 114 and the other to point 115 (see FIG. 1). The remainder of the channel is formed by electrostatic induction, between end regions 303 and 304 in that portion of region 302 immediately below its interface with the dielectric layer 307, responsive to potential applied to the gate electrode structure 308.

A P+-material guard ring 309 is diffused into the periphery of the P-material region 302 and contacted by metallization 306. Substrate 202 is ohmically contacted at a point not shown and connected to a potential lower than that at which any other portion of the integrated circuit is normally operated. A region 310 of N+-material shown only in plan view in FIG. 3 is diffused into N-material isolation tub 301, so the tub can be ohmically contacted by metallization 311 which is connected to a potential that reverse-biases the junction between region 301 and substrate 202 and the junction between regions 301 and 302—e.g., ground as shown in FIG. 1.

Figure 3:
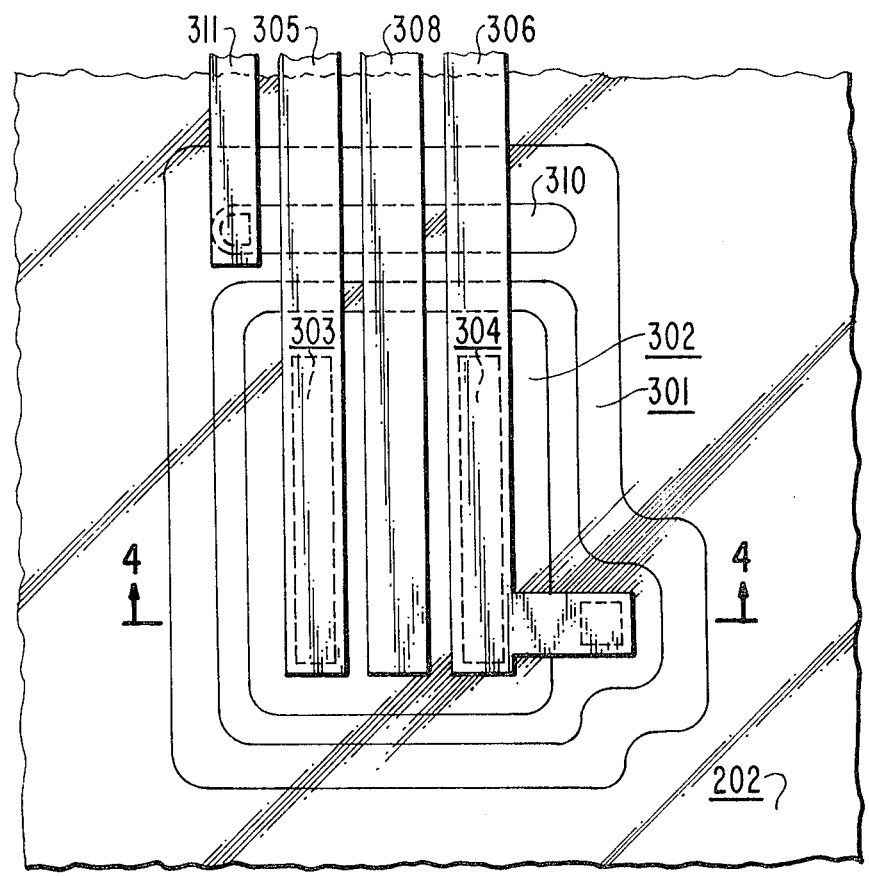
FIGS. 3 and 4 are plan and profile views of the type of field effect transistor used as an analog switch in series with the memory capacitor in effectuating the present invention.
Figure 4:
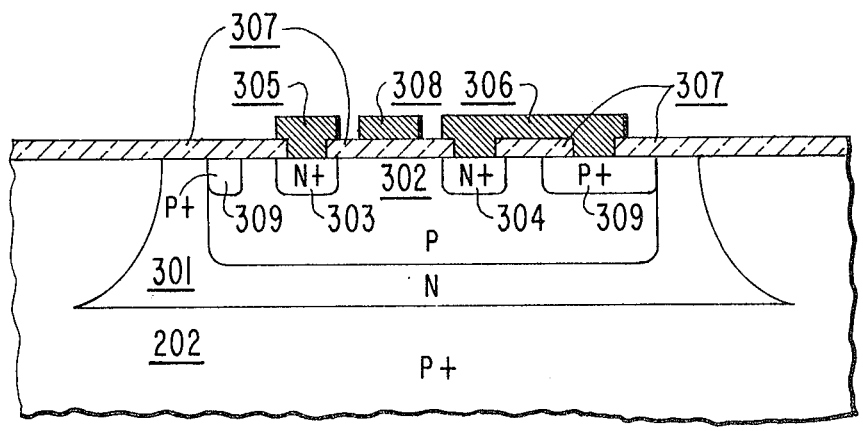

The following features are of interest in the enhancement-type N-channel field-effect transistor 117 shown in FIGS. 3 and 4. When the potential on the gate electrode structure 308 falls to ground, the channel induced by electrostatic induction no longer exists and so transistor 117 is no longer conductive between regions 303 and 304. Control potential for application to gate electrode structure 308 can be simply derived from the energizing potential itself by simple voltage translation methods. There is no need for signal inversion, as would be the case if the analog switch were provided by the controlled-conduction channel of a p-channel field-effect transistor formed within an N-material isolation tub. An undesired sneak path through which capacitor 2 will discharge will be established only if positive potential on the one of N-material regions 303 and 304 connected to point 115 exceeds the avalanche breakdown potential of the semiconductor junction between that region and the P-material region 302 in which it is located. The reverse potential required to cause such avalanche breakdown is quite large, usually being in excess of 5.5 volts—e.g., eight volts for processing used by RCA Corporation.

What is claimed is:

1. In a system including a memory capacitor together with a monolithic integrated circuit, said integrated circuit having a first point for connection to a point of reference potential and having a second point for making charge available for adding or subtracting to the charge on said memory capacitor, said monolithic integrated circuit being disposed on a substrate of semiconductor material of a first conductivity type having a surface covered by a layer of semiconductor material of a second conductivity type opposite to said first conductivity type, with means extending through said layer for dividing it into a plurality of isolation tubs and with means for defining the various circuit elements of said integrated circuit in separate ones of said isolation tubs, the improvement for substantially forestalling leakage of charge to or from said memory capacitor during intervals when energizing potential is not applied to portions of said monolithic integrated circuit connected to said first or second point, which improvement comprises:

an analog switch, having a control electrode and having a controlled conduction path for serial connection with said memory capacitor between the first and second points of said integrated circuit, and means for responding to the presence and absence of said energizing potential for applying a control signal to the control electrode of said analog switch that will condition its controlled conduction path for non-conduction during said intervals when energizing potential is not applied to portions of said monolithic integrated circuit connected to said first or second point.

2. The improved system set forth in claim 1 wherein said analog switch comprises:

means in a particular one of said isolation tubs for defining a conductor-insulator-semiconductor field effect transistor for conducting majority carriers of the type found in a region of first conductivity type; which means includes a region of semiconductor material of said first conductivity type within said particular isolation tubs and adjacent to its surface;

spaced regions of semiconductor material of said second conductivity type within said region of semiconductor material of said first conductivity type for defining the ends of a conduction channel;

a layer of insulating material covering the portion of said conduction channel adjacent to the surface of said region of semiconductor material of said first conductivity type;

a gate electrode disposed upon the side of said layer of insulating material remote from said conduction channel, said gate electrode being said control electrode; and means for contacting said spaced regions to provide drain and source electrodes; and means for galvanically connecting the conduction channel of said conductor-insulator-semiconductor transistor in series with said memory capacitor between the first and the second points of said monolithic integrated circuit.

3. In monolithically integrated circuitry disposed on a semiconductor substrate of certain conductivity type, provided first and second terminals for application of energizing potential therebetween, and provided third and fourth terminals for connection to opposite ends of a charge storage capacitor, said monolithically integrated circuit having included therewithin means which when supplied an operating potential responsive to energizing potential being supplied via said first and said second terminals is enabled to supply at a point charge to be stored on said capacitor, said monolithically integrated circuit also having included therewithin means which when not supplied energizing potential via said first and second terminals tends to present a path between said point at which charge is supplied and said fourth terminal as would discharge said capacitor were it connected directly between said point and said fourth terminal, the improvement for forestalling such discharge comprising:

an enhancement type field effect transistor having a gate electrode and having a channel of opposite conductivity type to that of said substrate, said channel being connected for selectively connecting said point at which charge is supplied and said third terminal;

means for responding to energizing potential being applied between said first and said second terminals to apply to said fourth terminal a first potential intermediate to the potentials at said first and said second terminals; and means for responding to energizing potential being applied between said first and said second terminals to apply to the gate electrode of said field effect transistor a second potential intermediate to the potentials at said first and said second terminals, said first intermediate potential being closer to the potential at said first terminal than said second intermediate potential is and said second intermediate potential being closer to the potential at said second terminal than said first intermediate potential is.

4. In monolithically integrated circuitry disposed on a semiconductor substrate of certain conductivity type, provided first and second terminals for application of energizing potential therebetween, and provided third and fourth terminals for connection to opposite ends of a charge storage capacitor; said monolithically integrated circuit having included therewithin means, which, when supplied an operating potential responsive to energizing potential being applied via said first and said second terminals, is enabled to supply at a point charge to be stored on said capacitor; said monolithically integrated circuit also having included therewithin means, which, when not supplied energizing potential via said first and second terminals, tends to present a path between said point at which charge is applied and said fourth terminal as would discharge said capacitor were it connected directly between said point and said fourth terminal; the improvement for forestalling such discharge comprising:
- a field effect transistor having a gate electrode and having a channel of opposite conductivity type to that of said substrate, said channel being connected for selectively connecting said point at which charge is supplied and said third terminal, said field effect transistor being an enhancement type that is non-conductive until potential between an end of its channel and its gate electrode exceeds a threshold potential $V_T$;
- a resistive element;
- a first avalanche diode with reverse breakdown voltage $V_1$ directly connected at one end to said first terminal, connected at the other end via said resistive element to said second terminal, and poled for avalanche conduction responsive to said energizing potential;
- means for applying $V_1$ as said operating potential;
- a second avalanche diode with reverse breakdown voltage $V_2$ connected between said first and said fourth terminals;
- means connected between said second and said fourth terminals for supplying avalance breakdown current to said first avalanche diode when said energizing potential exceeds $V_2$;
- a third avalanche diode with a breakdown voltage $V_3$ connected between said second terminal and the gate electrode of said field effect transistor, $V_3$ being larger than $V_1-V_2-V_T$; and
- means connected between the gate electrode of said field effect transistor and said first terminal for supplying avalanche breakdown current to said avalanche diode when said energizing potential exceeds $V_3$.

* * * * *

UNITED STATES PATENT OFFICE
CERTIFICATE OF CORRECTION

PATENT NO. : 4,034,239

DATED : July 5, 1977

INVENTOR(S) : Otto Heinrich Schade, Jr.

It is certified that error appears in the above-identified patent and that said Letters Patent are hereby corrected as shown below:

Column 2, line 14, change "detector" to --detectors--.

Column 4, lines 12-13, change resistors" to --transistors--

Column 8, line 8, change "avalance" to --avalanche--;

line 18, before "avalanche" insert --second--.

Signed and Sealed this

Thirteenth Day of December 1977

[SEAL]

Attest:

RUTH C. MASON
*Attesting Officer*

LUTRELLE F. PARKER
*Acting Commissioner of Patents and Trademarks*